US009753062B2

(12) United States Patent
Mazzarella et al.

(10) Patent No.: US 9,753,062 B2
(45) Date of Patent: Sep. 5, 2017

(54) SYSTEM AND METHOD FOR CURRENT MEASUREMENT IN THE PRESENCE OF HIGH COMMON MODE VOLTAGES

(71) Applicant: Maxim Integrated Products, Inc., San Jose, CA (US)

(72) Inventors: Federico Mazzarella, Binasco (IT); Massimiliano Musazzi, Como (IT)

(73) Assignee: Maxim Integrated Products, Inc., San Jose, CA (US)

( * ) Notice: Subject to any disclaimer, the term of this patent is extended or adjusted under 35 U.S.C. 154(b) by 345 days.

(21) Appl. No.: 14/666,228

(22) Filed: Mar. 23, 2015

(65) Prior Publication Data

US 2015/0260764 A1     Sep. 17, 2015

Related U.S. Application Data

(62) Division of application No. 13/443,495, filed on Apr. 10, 2012, now Pat. No. 8,988,063.

(51) Int. Cl.
  *G01R 1/30*     (2006.01)
  *G01R 19/00*    (2006.01)
  *G01R 17/16*    (2006.01)

(52) U.S. Cl.
  CPC ......... *G01R 19/0092* (2013.01); *G01R 17/16* (2013.01)

(58) Field of Classification Search
  CPC .......... G01R 1/30; G01R 19/23; G01R 17/16
  See application file for complete search history.

(56) References Cited

U.S. PATENT DOCUMENTS

| 5,790,526 | A  | * | 8/1998  | Kniess ...................... | H04L 5/16 |
|           |    |   |         |                                | 178/71.1  |
| 8,115,544 | B2 | * | 2/2012  | Trauth ...................... | H03F 1/30 |
|           |    |   |         |                                | 330/307   |
| 2006/0197626 | A1 | * | 9/2006 | Ehlers ...................... | G01R 27/28 |
|           |    |   |         |                                | 333/112   |
| 2010/0246858 | A1 | * | 9/2010 | Enjalbert .............. | H03F 1/0211 |
|           |    |   |         |                                | 381/120   |
| 2013/0257535 | A1 | * | 10/2013 | Mengad ................ | H03F 1/0211 |
|           |    |   |         |                                | 330/253   |

* cited by examiner

*Primary Examiner* — Tung X Nguyen
*Assistant Examiner* — Dominic Hawkins
(74) *Attorney, Agent, or Firm* — TIPS Group

(57) ABSTRACT

A system and method for making accurate current measurements by determining the differential voltage drop across a resistor in series with the load in the presence of large common mode voltages. A compensating voltage equal in magnitude but 180 degrees out of phase with a common mode voltage is generated and applied to a network of resistors connected to a measurement amplifier, thereby significantly reducing the magnitude of the common mode voltage at the measurement amplifier's inputs. An error correction voltage is generated and applied to the output of the measurement amplifier to compensate for errors in the values of the resistor network.

18 Claims, 4 Drawing Sheets

SYSTEM AND METHOD FOR CURRENT MEASUREMENT IN THE PRESENCE OF HIGH COMMON MODE VOLTAGES

CROSS REFERENCE TO RELATED APPLICATIONS

This application is a division of U.S. Ser. No. 13/443,495, filed Apr. 10, 2012, now U.S. Pat. No. 8,988,063, which is incorporated herein by reference.

BACKGROUND

In many electronic systems, it is desirable to measure electric currents flowing through a load. One such application is consumer audio devices, where it is desirable to measure the load current flowing to a speaker from a power amplifier. The measured current information is useful for determining the load on the amplifier for the purposes of determining overload conditions, or abnormal conditions such as short circuit loads that can damage the power amplifier.

Typically, the current measurement is made by placing a resistor in series with the load, and measuring the voltage drop across this resistor. The voltage drop can be converted to a measured current using Ohm's law. The voltage drop across the measurement resistor is minimized to reduce the impact of the measurement on the final voltage delivered to the load. A differential operational amplifier is often used to measure the very small voltage drop. The differential amplifier must have very good "common mode rejection" specifications, however, to accurately make this measurement.

Common mode rejection is the ability of an amplifier to subtract the effect of the same voltage applied to both its non-inverting and inverting inputs. An ideal amplifier would have an infinite common mode rejection ratio, resulting in no effect at its output if the same voltage were applied to its two inputs. In actual practice, a number of factors limit the use of such amplifiers. Firstly, these amplifiers can be expensive. Secondly, common mode rejection ratings of operational amplifiers are frequency dependent, often decreasing as frequency increases. This makes them less desirable for AC and complex audio signal measurements. Thirdly, the range of signal levels is limited to the power supply voltages of the measuring amplifier, making measurements of higher voltage signals found in power audio applications difficult or impractical.

These and other limitations of the prior art will become apparent to those of skill in the art upon a reading of the following descriptions and a study of the several figures of the drawing.

SUMMARY

In an embodiment, set forth by example and not limitation, a method for measuring an electrical current flowing in a load includes providing a measurement resistor having a first connecting terminal and a second connecting terminal, the load being electrically coupled to the second connecting terminal of the measurement resistor, the electrical current flowing through the measurement resistor; providing a first network resistor having a first connecting terminal and a second connecting terminal, the first connecting terminal being electrically coupled to the first connecting terminal of the measurement resistor; providing a second network resistor having a first connecting terminal and a second connecting terminal, the first connecting terminal being electrically coupled to the second connecting terminal of the measurement resistor; providing a third network resistor having a first connecting terminal and a second connecting terminal, the first connecting terminal being electrically coupled to the second connecting terminal of the first network resistor; providing a fourth network resistor having a first connecting terminal and a second connecting terminal, the first connecting terminal being electrically coupled to the second connecting terminal of the second network resistor, the second connecting terminal being electrically coupled to the second connecting terminal of the third network resistor; providing a first amplifier having an inverting input terminal, a non-inverting input terminal, and an output terminal, the non-inverting input terminal being electrically coupled to the second connecting terminal of the first network resistor, the inverting input terminal being electrically coupled to the second connecting terminal of the second network resistor; measuring a common mode voltage at the second connecting terminal of the measurement resistor; creating a compensating voltage equal in magnitude to the common mode voltage 180 degrees out of phase with the common mode voltage; applying the compensating voltage to the second connecting terminal of the third and fourth network resistors; and measuring an output voltage from the first amplifier.

In another embodiment, set forth by example and not limitation, a method for measuring an electrical current flowing in a load includes providing a measurement resistor having a first connecting terminal and a second connecting terminal, the load being electrically coupled to the second connecting terminal of the measurement resistor, the electrical current flowing through the measurement resistor; providing a first network resistor having a first connecting terminal and a second connecting terminal, the first connecting terminal being electrically coupled to the first connecting terminal of the measurement resistor; providing a second network resistor having a first connecting terminal and a second connecting terminal, the first connecting terminal being electrically coupled to the second connecting terminal of the measurement resistor; providing a third network resistor having a first connecting terminal and a second connecting terminal, the first connecting terminal being electrically coupled to the second connecting terminal of the first network resistor; providing a fourth network resistor having a first connecting terminal and a second connecting terminal, the first connecting terminal being electrically coupled to the second connecting terminal of the second network resistor, the second connecting terminal being electrically coupled to the second connecting terminal of the third network resistor; providing a first amplifier having an inverting input terminal, a non-inverting input terminal, and an output terminal, the non-inverting input terminal being electrically coupled to the second connecting terminal of the first network resistor, the inverting input terminal being electrically coupled to the second connecting terminal of the second network resistor; providing a DC reference voltage; providing a second amplifier having an inverting input terminal, a non-inverting input terminal, and an output terminal, the non-inverting input being electrically coupled to the DC reference voltage, the inverting input being electrically coupled to the second connecting terminal of the second network resistor, the output being electrically coupled to the second connecting terminal of the fourth network resistor; and measuring an output voltage from the output terminal of the first amplifier.

In another embodiment, set forth by example and not limitation, an apparatus for measuring an electrical current flowing in a load includes a measurement resistor having a first connecting terminal and a second connecting terminal, the load being electrically coupled to the second connecting terminal of the measurement resistor, the electrical current flowing through the measurement resistor; a bridged power amplifier having a non-inverting output terminal and an inverting output terminal, the non-inverting output terminal of being electrically coupled to the first connecting terminal of the measurement resistor, the inverting output terminal being connected to the load; a first network resistor having a first connecting terminal and a second connecting terminal, the first connecting terminal being electrically coupled to the first connecting terminal of the measurement resistor; a second network resistor having a first connecting terminal and a second connecting terminal, the first connecting terminal being electrically coupled to the second connecting terminal of the measurement resistor; a third network resistor having a first connecting terminal and a second connecting terminal, the first connecting terminal being electrically coupled to the second connecting terminal of the first network resistor; a fourth network resistor having a first connecting terminal and a second connecting terminal, the first connecting terminal being electrically coupled to the second connecting terminal of the second network resistor, the second connecting terminal being electrically coupled to the second connecting terminal of the third network resistor; a first operational amplifier having an inverting input terminal, a non-inverting input terminal, and an output terminal, the non-inverting input terminal being electrically coupled to the second connecting terminal of the first network resistor, the inverting input terminal being electrically coupled to the second connecting terminal of the second network resistor, wherein the electrical current is measured by monitoring a voltage at the output terminal of the first operational amplifier.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
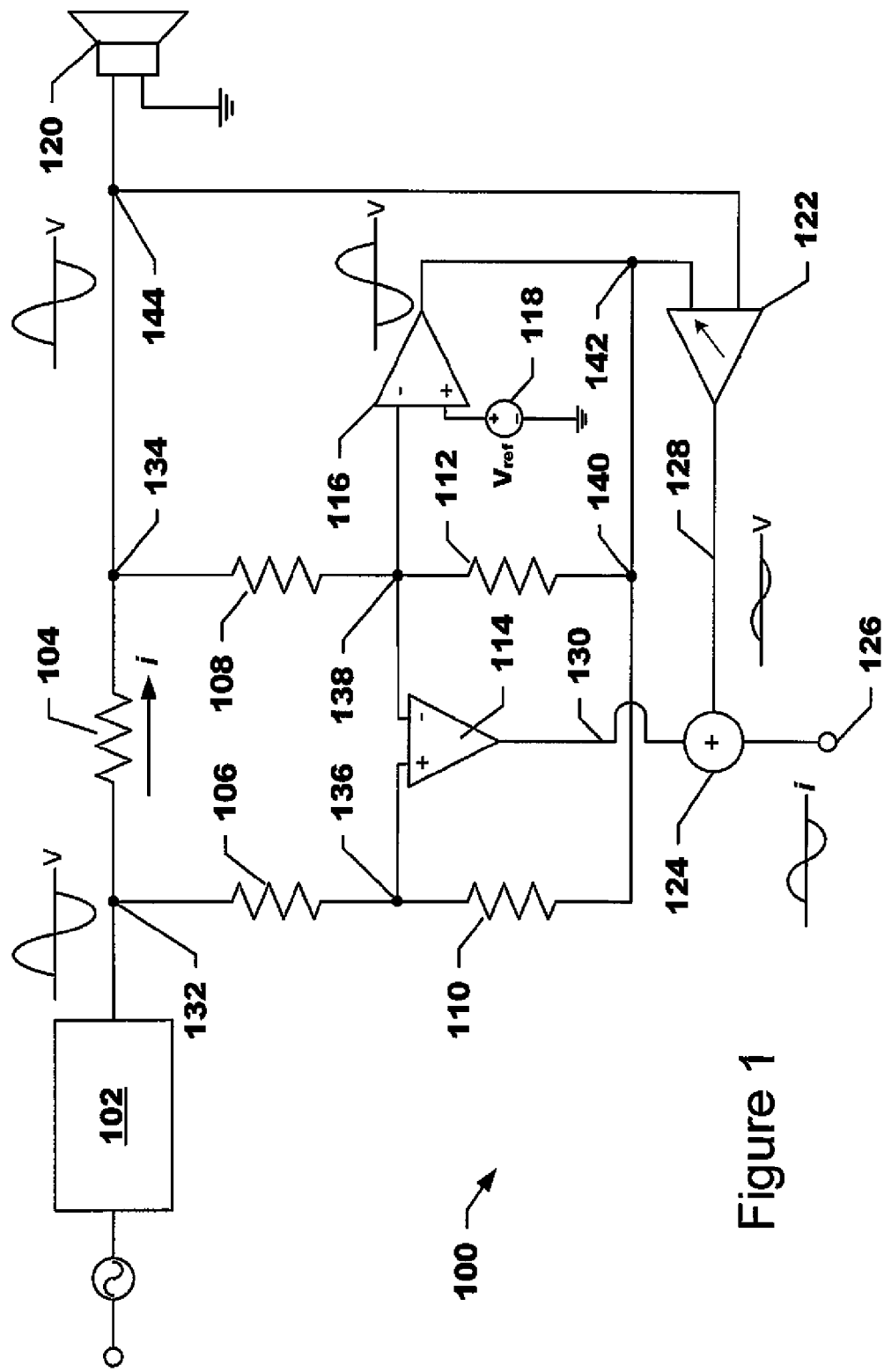
FIG. 1 is a schematic of an example current measurement system.

FIG. 1 is a schematic of an example current measurement system 100. In this example, a power amplifier 102 drives load 120 with an AC signal. The signal is illustrated as a sine wave but, in practice, the signal can also include complex waveforms such as music signals. The power amplifier may be a class D switching amplifier or a linear power amplifier, as is known to those skilled in the art.

In the example measurement system 100, power amplifier 102 is single ended, meaning the load is connected from its output (at circuit node 132) and ground. A load current i flows from power amplifier 102 to load 120 through measurement resistor 104. Typically, for example, measurement resistor 104 will have a value on the order of 0.1 ohm, load 120 having values ranging from 2 to 16 ohms, and load current i ranging from milliamps to a few amperes. Load current i is determined by measuring the voltage drop across measuring resistor 104.

Due to the large difference in values between the load 120 and the measurement resistor 104, a small differential voltage drop exists across measurement resistor 104, which may be measured by subtracting two essentially equal and much larger voltages. A common mode voltage is present at circuit node 134 and the common mode voltage plus the differential measurement voltage is present at circuit node 132. Subtracting these two voltages yields the differential measurement voltage across resistor 104.

Figure 4:
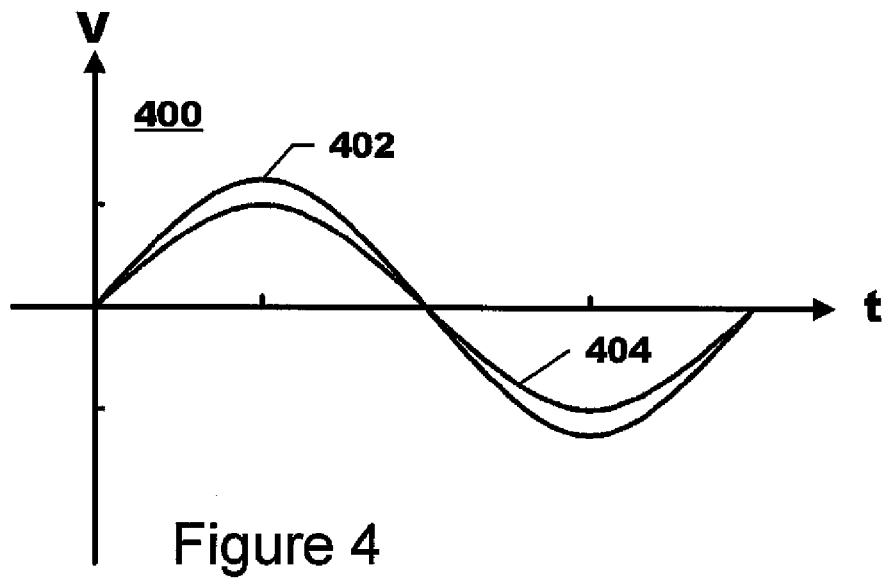
FIG. 4 is a graph of voltages at nodes 132 and 134 in the example current measurement system.

Referring to FIG. 4, graph 400 illustrates the relationship between the common mode voltages of this example. Curve 404 represents an example common mode voltage at circuit node 134. Curve 402 represents an example voltage at circuit node 132. The differences between the two waveforms have been exaggerated for illustration purposes, but in reality may so small as to be visually indistinguishable.

Returning to FIG. 1, with the example measurement system 100, the differential voltage across resistor 104 is developed with the aid of operational amplifiers 114 and 116, along with network resistors 106, 108, 110, and 112. Resistors 106, 108, 110, and 112 are designed to be of essentially equal resistance values, typically, for example 300K ohms.

Operational amplifier 116, in this example, is configured to generate a waveform equal in magnitude to the common mode voltage at circuit node 134, referenced to a voltage provided by DC source 118. The common mode compensation voltage generated by amplifier 116, while equal in magnitude to the common mode voltage, is 180 degrees out of phase. This voltage is present at circuit nodes 140, 142.

Figure 5:
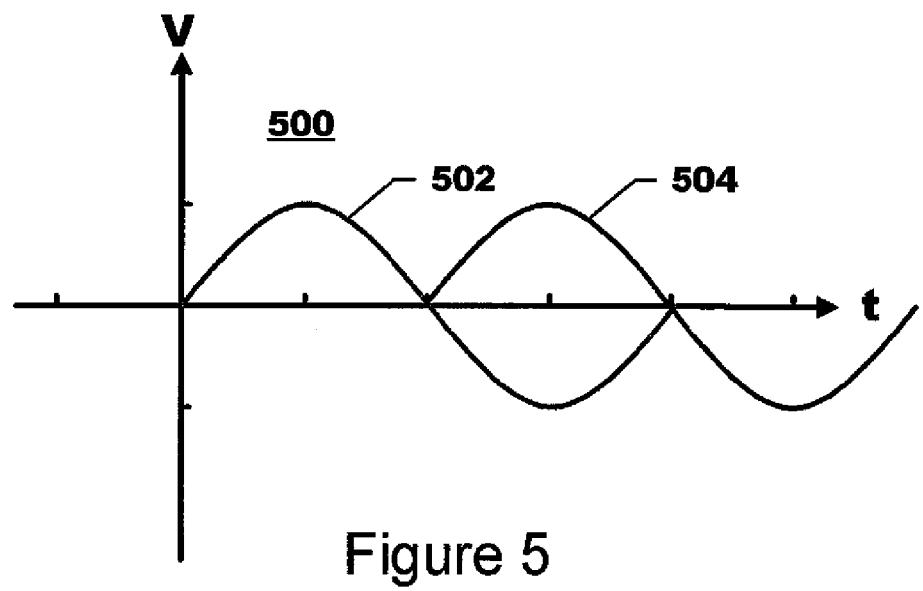
FIG. 5 is a graph of voltages at nodes 136 and 138 in the example current measurement system.

Referring to FIG. 5, graph 500 illustrates the relationship between an example common mode voltage 502 and the compensation voltage 504. Applying the compensation voltage generated by amplifier 116 to circuit node 140 and to resistors 110 and 112, results in the cancellation of the common mode voltages at circuit nodes 136 and 138, the inputs of amplifier 114. Amplifier 116 holds node 138 at a reference voltage set by DC source 118, while a voltage equal to the reference voltage plus the differential measurement voltage across resistor 104 is present at circuit node 136. The common mode voltage across the input of measurement amplifier 114 has been reduced to the reference voltage set by source 118. This can be set to any convenient value compatible with the operation of amplifier 114, including ground (zero potential).

Returning to FIG. 1, network resistors 106, 108, 110, and 112 can generate errors if they are not identical in value. In practice, no resistor can be made "identical" in value to any other. While trimming of resistors 106-112 is possible during manufacture, tolerances may still be too large to provide acceptable error performance. To reduce errors contributed by resistors 106-112, variable gain amplifier/attenuator 122 is provided. Amplifier 122 combines the compensation voltage output by amplifier 116 with common mode voltage at nodes 134, 144 to produce an error correction voltage at its output 128. This voltage is summed with the output 130 of amplifier 114 at junction 124 to compensate for any errors generated by the resistor network 106-112.

In one example, the error correction voltage can be determined by removing load 120 while having a suitable output voltage from power amplifier 102. Since no current is flowing, the output from amplifier 114 should be zero. Any errors in the resistors 106-112 will produce an error voltage at the output of amplifier 114, which can be "nulled" to zero by an error correction voltage from amplifier 122, which is adjusted by altering the amplifier's gain. Since the error voltage is proportional to the magnitude of the common mode voltage, amplifier 122 compensates for this effect by providing an error correction voltage that is also proportional to the magnitude of the common mode voltage.

Figure 2:
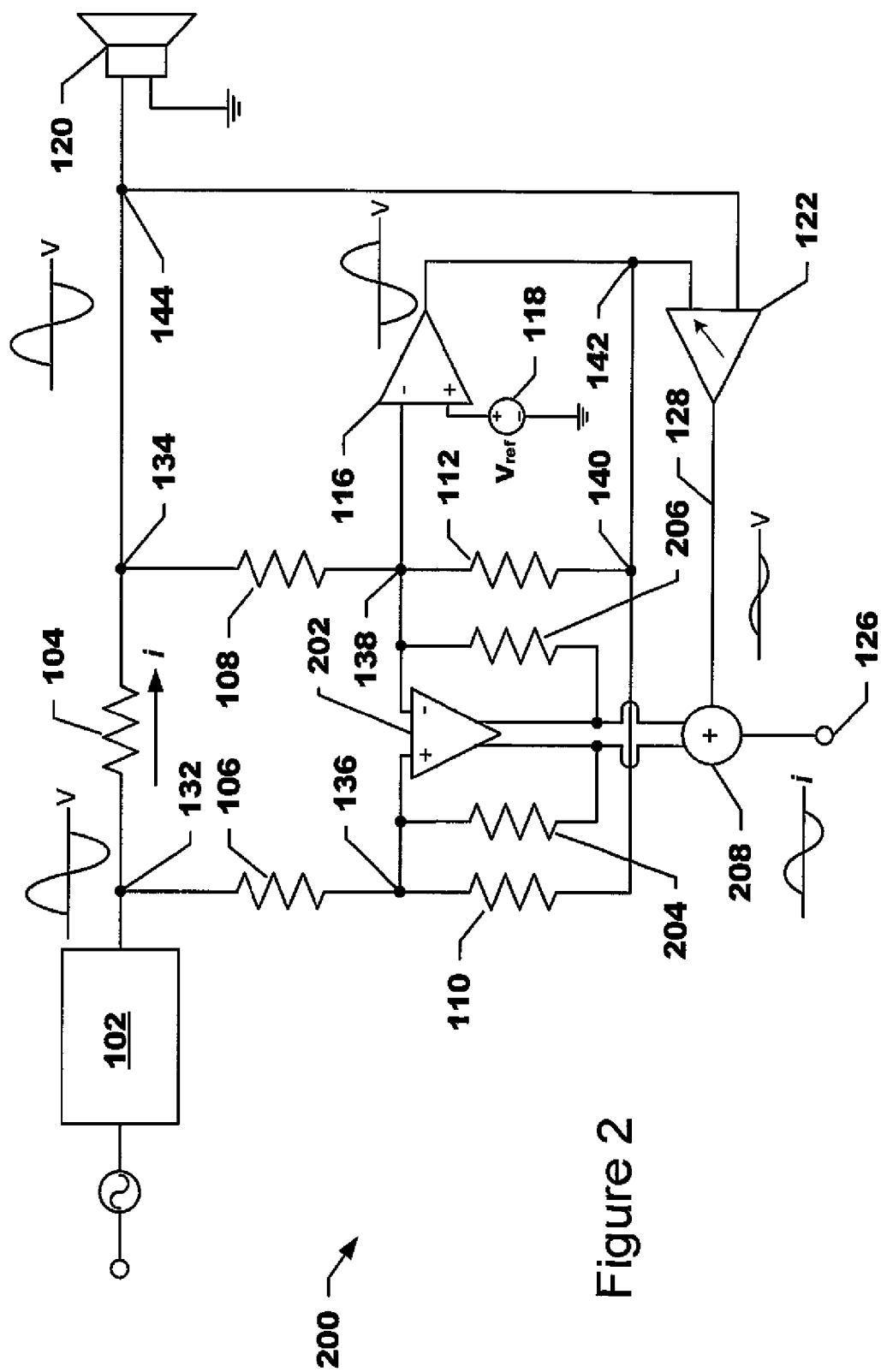
FIG. 2 is a schematic of a second example current measurement system.

FIG. 2 is a schematic of another example current measurement system 200. In this example embodiment, measurement amplifier 114 in FIG. 1 is replaced with a differential output amplifier 202 and resistors 204, 206. A differential output amplifier provides two voltage outputs, each having opposing polarities. Summing junction 208 is configured to sum the (absolute) magnitudes of the two voltage outputs by phase shifting one output by 180 degrees. This summed output is added to the error correction voltage from amplifier 122 as previously described.

Figure 3:
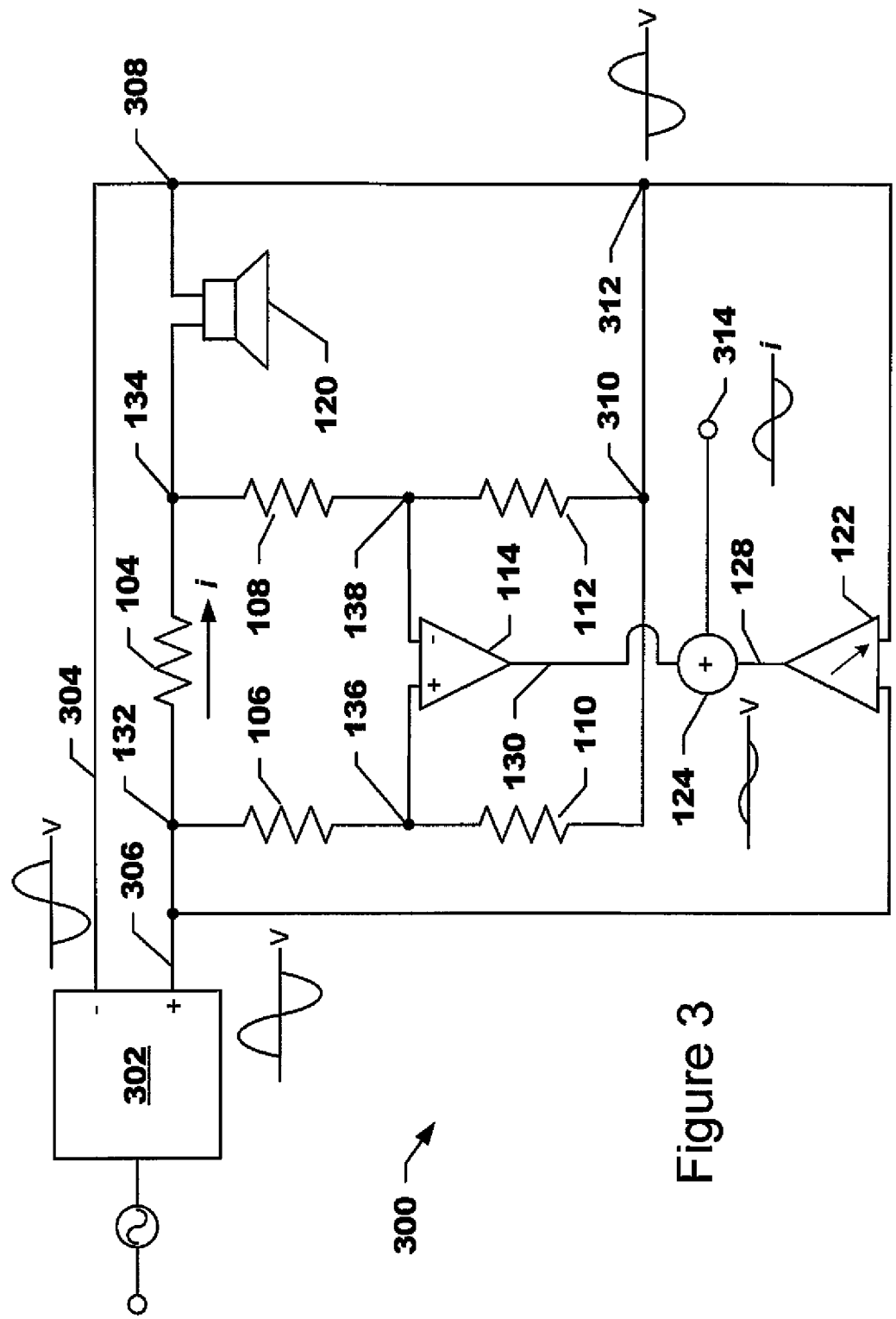
FIG. 3 is a schematic of a third example current measurement system.

FIG. 3 is a schematic of a still further example current measurement system 300. In this example embodiment, power amplifier 302 is a differential output amplifier producing two outputs of opposing polarity, 180 degrees out of phase with each other. These amplifiers may also be referred to as "bridged" amplifiers because they can be created from combining two single ended amplifiers (like amplifier 102 of FIGS. 1 & 2). This is done by inverting the input on one amplifier and connecting the load across the outputs of both amplifiers instead of being grounded.

A potential advantage to the example embodiment of FIG. 3 is that the common mode compensating voltage is generated by the power amplifier 302 directly, and is present at circuit node 308. The common mode voltage is still present at circuit node 134, as in previously described embodiments. Amplifier 116 and reference source 118 are not required in this embodiment. The function and operation of amplifiers 114 and 122 remain as previously described above in FIG. 1.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A method for measuring an electrical current flowing in a load comprising:
providing a measurement resistor, said resistor having a first connecting terminal and a second connecting terminal, said load being electrically coupled to said second connecting terminal of said measurement resistor, said electrical current flowing through said measurement resistor;
providing a first network resistor, said first network resistor having a first connecting terminal and a second connecting terminal, said first connecting terminal of said first network resistor being electrically coupled to said first connecting terminal of said measurement resistor;
providing a second network resistor, said second network resistor having a first connecting terminal and a second connecting terminal, said first connecting terminal of said second network resistor being electrically coupled to said second connecting terminal of said measurement resistor;
providing a third network resistor, said third network resistor having a first connecting terminal and a second connecting terminal, said first connecting terminal of said third network resistor being electrically coupled to said second connecting terminal of said first network resistor;
providing a fourth network resistor, said fourth network resistor having a first connecting terminal and a second connecting terminal, said first connecting terminal of said fourth network resistor being electrically coupled to said second connecting terminal of said second network resistor, said second connecting terminal of said fourth network resistor being electrically coupled to said second connecting terminal of said third network resistor;
providing a first amplifier, said first amplifier having an inverting input terminal, a non-inverting input terminal, and an output terminal, said non-inverting input terminal of said first amplifier being electrically coupled to said second connecting terminal of said first network resistor, said inverting input terminal of said first amplifier being electrically coupled to said second connecting terminal of said second network resistor;
providing a DC reference voltage;
providing a second amplifier, said second amplifier having an inverting input terminal, a non-inverting input terminal, and an output terminal, said non-inverting input of said second amplifier being electrically coupled to said DC reference voltage, said inverting input of said second amplifier being electrically coupled to said second connecting terminal of said second network resistor, said output of said second amplifier being electrically coupled to said second connecting terminal of said fourth network resistor;
measuring an output voltage from said output terminal of said first amplifier;
providing a third amplifier, said third amplifier having a variable gain, said third amplifier having a first input terminal, a second input terminal, and an output terminal, said first input terminal of said third amplifier being electrically coupled to said first connecting terminal of said second network resistor, said second input terminal of said third amplifier being electrically coupled to said second connecting terminals of said third and said fourth network resistors;
generating an error correction voltage at said output of said third amplifier by adjusting said variable gain of said third amplifier; and
adding said error correction voltage to said output voltage of said first amplifier.

2. A method as recited in claim 1 comprising:
flowing a reference current through said measurement resistor;

adjusting said gain of said third amplifier such that a sum of said error correcting voltage and said output voltage from said first amplifier indicate said reference current is measured.

3. A method as recited in claim 2 wherein said reference current is approximately zero, and said gain of said third amplifier is adjusted such that said sum of said error correcting voltage and said output voltage from said first amplifier is approximately zero.

4. An apparatus for measuring an electrical current flowing in a load comprising:
 a measurement resistor, said resistor having a first connecting terminal and a second connecting terminal, said load being electrically coupled to said second connecting terminal of said measurement resistor, said electrical current flowing through said measurement resistor;
 a bridged power amplifier, said power amplifier having a non-inverting output terminal and an inverting output terminal, said non-inverting output terminal of said power amplifier being electrically coupled to said first connecting terminal of said measurement resistor, said inverting output terminal of said power amplifier being connected to said load;
 a first network resistor, said first network resistor having a first connecting terminal and a second connecting terminal, said first connecting terminal of said first network resistor being electrically coupled to said first connecting terminal of said measurement resistor;
 a second network resistor, said second network resistor having a first connecting terminal and a second connecting terminal, said first connecting terminal of said second network resistor being electrically coupled to said second connecting terminal of said measurement resistor;
 a third network resistor, said third network resistor having a first connecting terminal and a second connecting terminal, said first connecting terminal of said third network resistor being electrically coupled to said second connecting terminal of said first network resistor;
 a fourth network resistor, said fourth network resistor having a first connecting terminal and a second connecting terminal, said first connecting terminal of said fourth network resistor being electrically coupled to said second connecting terminal of said second network resistor, said second connecting terminal of said fourth network resistor being electrically coupled to said second connecting terminal of said third network resistor and said inverting output terminal of said power amplifier; and
 a first operational amplifier, said first operational amplifier having an inverting input terminal, a non-inverting input terminal, and an output terminal, said non-inverting input terminal of said first operational amplifier being electrically coupled to said second connecting terminal of said first network resistor, said inverting input terminal of said first operational amplifier being electrically coupled to said second connecting terminal of said second network resistor,
 wherein said electrical current is measured by monitoring a voltage at said output terminal of said first operational amplifier.

5. An apparatus as recited in claim 4 further comprising:
 a second operational amplifier, said second operational amplifier having a variable gain, said second operational amplifier having a first input terminal, a second input terminal, and an output terminal, said first input terminal of said second operational amplifier electrically coupled to said non-inverting output of said power amplifier, said second input of said second operational amplifier electrically coupled to said inverting output of said power amplifier;
 a summing junction, said summing junction having a first input, a second input, and an output, said first input of said summing junction electrically coupled to said output terminal of said first operational amplifier, said second input of said summing junction electrically coupled to said output terminal of said second operational amplifier,
 wherein said electrical current is measured by monitoring a voltage at said output of said summing junction.

6. An apparatus as recited in claim 4 wherein said measurement resistor is approximately 0.1 ohms.

7. An apparatus as recited in claim 4 wherein said first network resistor, said second network resistor, said third network resistor, and said fourth network resistor have values between 100K ohms and 500K ohms.

8. An apparatus as recited in claim 4 wherein said first network resistor, said second network resistor, said third network resistor, and said fourth network resistor have values of approximately 300K ohms.

9. An apparatus for measuring an electrical current flowing in a load comprising:
 a differential output amplifier having a first output and a second output of opposing polarities;
 a measurement resistor adapted to couple one of the first output and second output of the differential output amplifier to a load, whereby a current operationally flowing through the measurement resistor is representative of the current flowing through the load;
 a resistive bridge coupled across the measurement resistor; and
 a measurement amplifier coupled to the resistive bridge, whereby the differential output amplifier generates a common mode compensating voltage across the load and an output of the operational amplifier is related to the current flowing through the load.

10. An apparatus for measuring an electrical current flowing through a load as recited in claim 9 wherein the first output and the second output of the differential output amplifier are 180° out of phase.

11. An apparatus for measuring an electrical current flowing through a load as recited in claim 10 wherein the differential output amplifier is a bridged amplifier.

12. An apparatus for measuring an electrical current flowing through a load as recited in claim 11 wherein the differential output amplifier is a power amplifier.

13. An apparatus for measuring an electrical current flowing through a load as recited in claim 12 wherein the measurement amplifier is an operational amplifier having a non-inverting input and an inverting input.

14. An apparatus for measuring an electrical current flowing through a load as recited in claim 13 wherein the resistive network includes a first voltage divider and a second voltage divider.

15. An apparatus for measuring an electrical current flowing through a load as recited in claim 14 wherein the non-inverting input of the measurement amplifier is coupled to a first node of the first voltage divider and the inverting input of the measurement amplifier is coupled to a second node of the second voltage divider.

16. An apparatus for measuring an electrical current flowing through a load as recited in claim 15 wherein common mode voltages are effectively cancelled at the non-inverting input and the inverting input of the measurement amplifier.

17. An apparatus for measuring an electrical current flowing through a load as recited in claim 16 further comprising an error correction amplifier having a first input coupled to the first output of the differential output amplifier and a second input coupled to the second output of the differential output amplifier.

18. An apparatus for measuring an electrical current flowing through a load as recited in claim 17 further comprising a summer having a first input coupled to the output of the measurement amplifier and a second input coupled to the output of the error correction amplifier.

* * * * *